July 9, 1957 D. J. CARLSON 2,799,008

SIGNAL COUPLING SYSTEM

Filed April 30, 1956 3 Sheets-Sheet 1

INVENTOR.
David J. Carlson
BY
H. C. Newton
ATTORNEY.

July 9, 1957 D. J. CARLSON 2,799,008

SIGNAL COUPLING SYSTEM

Filed April 30, 1956 3 Sheets-Sheet 2

INVENTOR.
David J. Carlson
BY H. W. Newton

ATTORNEY.

SIGNAL COUPLING SYSTEM

Filed April 30, 1956 3 Sheets-Sheet 3

INVENTOR.
David J. Carlson
BY H. L. Newton
ATTORNEY.

United States Patent Office 2,799,008

Patented July 9, 1957

2,799,008

SIGNAL COUPLING SYSTEM

David J. Carlson, Haddon Heights, N. J., assignor to Radio Corporation of America, a corporation of Delaware Application April 30, 1956, Serial No. 581,596

8 Claims. (Cl. 333—70)

This invention relates to coupling systems for high frequency signal conveying circuits, and more particularly relates to low side reactive signal coupling systems for the tuning circuits of multiband receivers.

Two types of coupling systems which have heretofore been used to convey signals to or between receiver tuning circuits are known as low side capacitive and low side inductive coupling systems. In these systems the low signal potential sides of the circuits to be coupled are connected to ground through a common impedance means, such as an inductor or capacitor, and the coupling is effected by the circulating current in the common impedance means.

These coupling systems, while effective for certain applications, are not generally adaptable for use in multiband receivers and involve the use of additional circuit elements or switching connections. The problem of providing a simple and effective coupling system operable over a wide range of signal frequencies, is of increased complexity in multiband tuners such as an all channel V. H. F.-U. H. F. television tuner which must be operable over the extremely wide range of signal frequencies extending from 54 megacycles to 890 megacycles, and in which the coupling must be carefully controlled to provide the proper bandwidth in tuning over the V. H. F. and U. H. F. channels.

It is accordingly an object of the present invention to provide an improved and simplified wide band coupling system for wide band or multiband receiver tuning circuits which is operable to convey signals to and between the tuning circuits of the receiver without the necessity of additional circuit components or complicated switching.

It is another object of the invention to provide an improved wide band all-channel signal coupling system for the tuning circuits of a V. H. F.-U. H. F. television tuner which is simple in construction, yet capable of providing controlled coupling to and between the tuning circuits of the tuner over the entire U. H. F. and V. H. F. television bands.

In accordance with the invention, the signal coupling system includes a conductive member such as a shield wall supported in a conductive chassis, the chassis being at signal ground potential for said system. The conductive member is insulated from the chassis and a predetermined capacitance is provided between the shield and the chassis. An inductor is connected in parallel with this capacitance to form a parallel resonant circuit which, in the case of a television tuner, resonates at a frequency between the two frequency ranges assigned for the operation of V. H. F. television channels, so that it appears inductive to signals in the lower V. H. F. television range, and capacitive to signals in the higher V. H. F. television range. The low signal potential side of the tuner circuits to be coupled are connected to the chassis by way of the shield and the effective reactance of the parallel resonant circuit. The reactance of the parallel resonant circuit provides low side inductive coupling for signals in the lower V. H. F. television range, and low side capacity coupling for signals in the upper V. H. F. television range. For higher frequency bands such as the U. H. F. television band, the parallel circuit appears effectively as a short-circuit connected between the conductive member and the chassis. However, the inductance of the conductive member between the effective point of contact of the U. H. F. tuner circuits and the chassis is sufficient to provide low side inductance coupling for signals in the U. H. F. frequency band.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings, in which:

Figure 1 is a side elevational view of an all-channel U. H. F.-V. H. F. television tuner including wide band all-channel signal coupling system embodying the invention;

Figure 1:
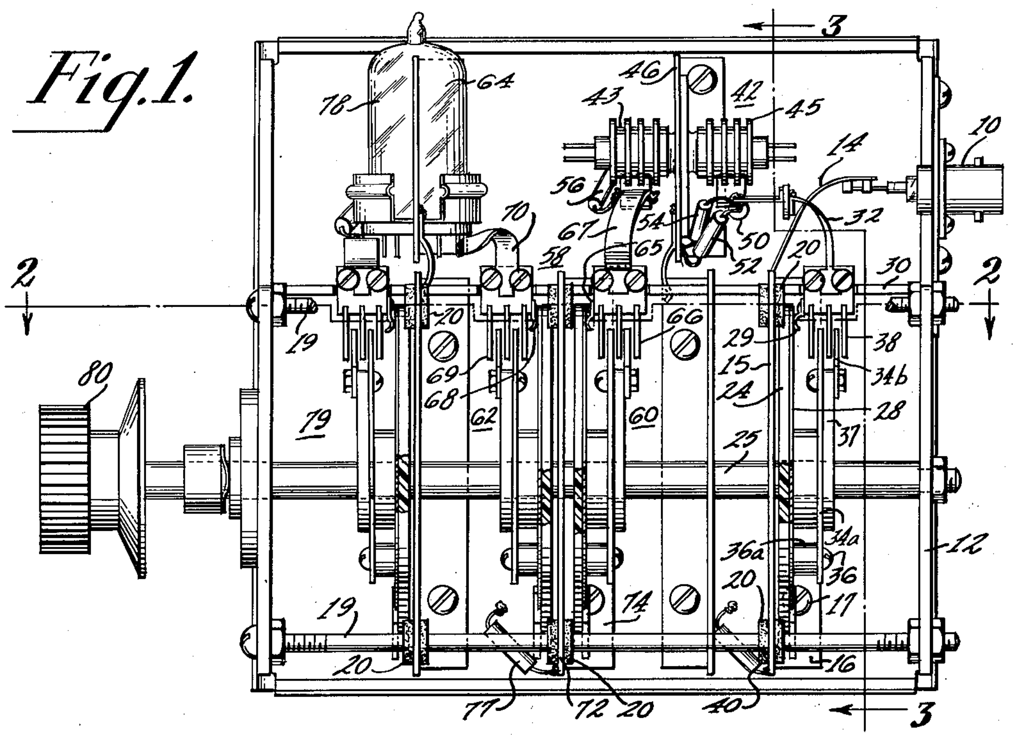
Figure 2:
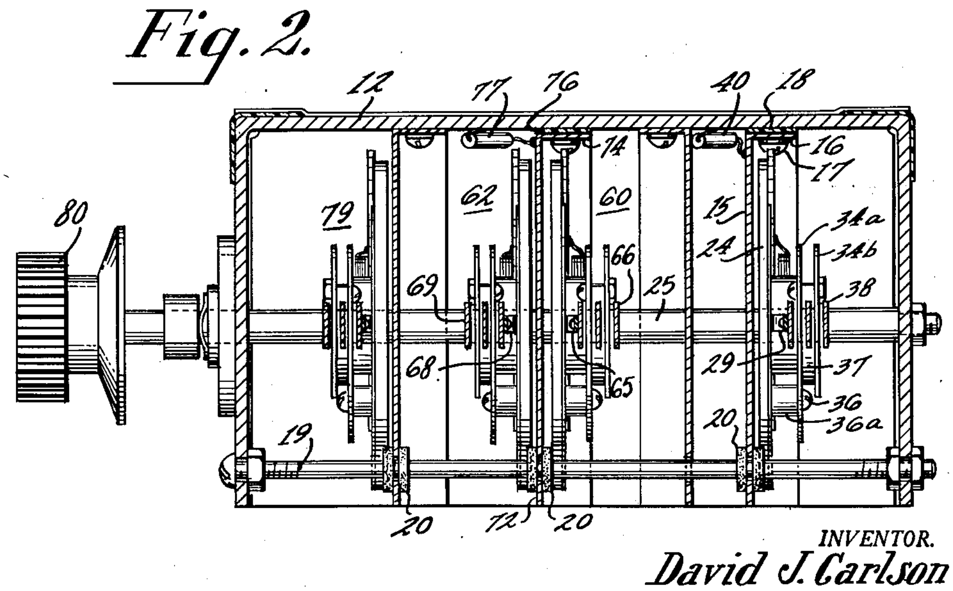
Figure 2 is a sectional view of the all-channel television tuner shown in Figure 1 taken on the section lines 2—2.

Reference is now made to the drawings in which like reference numerals are used throughout the various figures to designate similar components, and particularly to Figures 1 to 5, which show an all-channel television tuner operable to select any one of the 82 V. H. F. and U. H. F. television channels. The V. H. F. television channels 2 to 13 have been assigned two separate frequency ranges extending from 54 to 88 megacycles (mc.) for channels 2 to 6, and from 174 to 216 mc. for channels 7 to 13. The U. H. F. television band which includes channels 14 to 83 has been assigned the frequency range of 470 to 890 megacycles.

The all-channel television tuner includes tuning circuits for selecting any one of the 82 television channels, a radio frequency (R. F.) amplifier for amplifying the selected signal, and a mixer-oscillator circuit for converting the amplified signal to the corresponding intermediate frequency signal. The tuning circuits for the tuner include a signal selection circuit as a portion of the input circuit of the R. F. amplifier, and a double tuned circuit between the R. F. amplifier and the signal mixer stages. An additional tuning circuit is also provided for the local oscillator stages so that a heterodyning signal of the proper frequency is generated to convert the received signals to the receiver intermediate frequency.

In an all-channel tuner of this type it is desirable to provide a simple and effective coupling device between the signal selection circuit and the antenna circuit, and between the separate sections of the double tuned coupling circuit in order to avoid the necessity for separate coupling circuits and the associated switching complications. The problems attendant with providing such a coupling circuit is apparent in view of the extremely wide frequency range of 54 to 890 mc., over which the circuit must be operable. In accordance with the invention, a simple and effective all-channel low side capacity and inductance coupling system is provided as will be described hereinafter.

Signals from a U. H. F.-V. H. F. television antenna, not shown, are conveyed to an antenna input terminal 10, which is mounted on a conductive chassis 12, the chassis being at reference potential or ground for the tuner. The antenna input terminal 10 is connected through a conductor 14 to a conductive shield member 15. The shield member 15, which forms one of the elements of the signal coupling system of the invention has a bent over or flange portion 16 which is fastened to the chassis 12 by the screws 17. Insulating washers **17*a* are positioned under the screw 17 heads so that no electrical connection is made through the screws 17 between the chassis 12 and the shield member 15. The shield member 15 is insulated from the chassis 12 by the insulating strip 18 wihch is positioned between the flange 16 and the chassis. The shield member 15 is further supported in the conductive chassis 12 by a pair of transverse rods 19 which are secured between the end walls of the chassis. The rods 19 are insulated from the shield member by suitable grommets 20**.

The tuning elements for the signal selection circuit 22 of the all-channel television tuner are mounted about the periphery of a rotatable disc 24 of insulating material. The disc 24 is affixed to a tuning control shaft 25 mounted for rotation between the end walls of the tuner chassis. As can best be seen in Figures 3 and 4, the tuning elements for the V. H. F. television channel frequencies which occupy about half the disc periphery include a plurality of inductors 26 which are connected between the twelve contact elements 27. The V. H. F. tuning elements are of the conventional construction and include lumped inductors between the first six contacts elements (corresponding to channels 2–7), and an arcuate conductor with portions of reduced width between the remaining contact elements. The arcuate conductor provides the necessary inductance for tuning the signal selection circuit 22 to the frequency of channels 8 to 13.

One end 31 of the series connected inductors 26 is connected to a conductive ground plane means 28 which is formed on, and covers about one-half of the area of the disc 24. The ground plane means 28, which also extends to the opposite side of the disc 24, is positioned closely adjacent the shield member 15, and the resulting capacitance between the shield member 15 and the ground plane means 28 is sufficient to provide a low impedance path for V. H. F. signals to the shield member 15.

A V. H. F. tuning circuit contactor 29 is mounted on an insulating support member 30. The contactor 29 is positioned to conductively engage successive ones of the contact elements 27 as the disc 24 is rotated about its axis. When the V. H. F. contactor 29 engages the contact element which is connected to the ground plane means 28, the signal selection circuit is tuned to the frequency of television channel 13. As the disc 24 is then rotated in a counter-clockwise direction to the other V. H. F. contact terminals, additional inductors are successively connected in circuit between the contactor 29 and the ground plane means 28, until at the channel 2 position, all of the series inductors 26 are in connection between the V. H. F. contactor 29 and the ground plane means 28. The V. H. F. contactor 29 is connected to the cathode of an R. F. amplifier 42 through an inductor 32.

The tuning element for the U. H. F. channels comprises a quarter wave resonant transmission line 34 which includes an arcuate conductor **34*a* positioned in spaced relation above the conductive ground plane means 28. One end of the conductor 34*a* is conductively connected to the ground plane means through a supporting screw 36 and the associated spacer 36*a*. The other end of the conductor is supported by an insulating arm 37 which is mounted on the shaft 25 for rotation with the disc 24. The conductive ground plane provides a low impedance path to the shield member 15** for U. H. F. signal frequencies, and enables a higher Q for the tuned circuit by avoiding erratic contact resistance in the usual wiping contact.

A U. H. F. capacitive contact member 38 is mounted on the insulating support 30 adjacent the V. H. F. contactor 29. This contact member may be conductive or capacitive, and, if desired, the V. H. F. contactor and U. H. F. contact member may comprise a single element. As can be best seen in Figures 1 and 2, the capacitive contact member 38, as provided in the present example, has three parallel plates, two of which are positioned to mesh with the conductor **34*a* as the disc 24 is rotated. The tunable resonant transmission line 34 also has an additional conductor 34*b* which is spaced from but conductively connected to the open circuit end of the arcuate conductor 34*a*. The conductor 34*b* serves to provide additional capacitance between the transmission line 34 and the capacitive contact member 38 near the low frequency end of the V. H. F. tuning range, and enables a more uniform change in frequency with rotational movement of the disc 24**.

Figure 3:
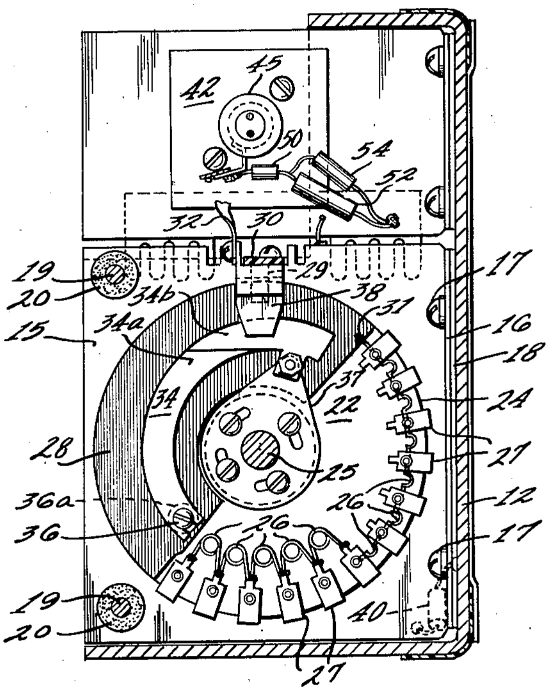
Figure 3 is a sectional view of the all-channel television tuner of Figure 1 taken on the section lines 3—3.
Figure 4:
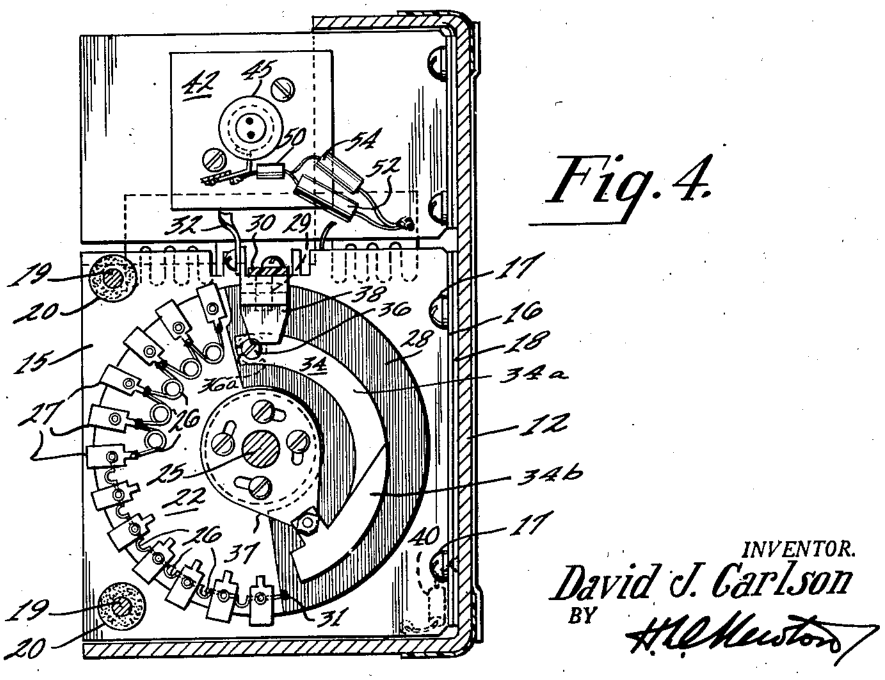
Figure 4 is a sectional view of the all-channel television tuner shown in Figure 1, taken on the section lines 3—3, but with the tuning circuits thereof rotated to a different channel selecting position.

The frequency of resonance of the tunable transmission line 34 is controlled by the angular position of the disc 24 and is determined by the length of the conductor **34*a* between the capacitive contact 38 and the screw 36 which connects the conductor 34*a* to the ground plane means 28. As shown in Figure 3, most of the length of the conductor 34*a* is in circuit between the capacitive contact 38 and the ground plane means 28, and the transmission line is tuned to a frequency near the low end of the U. H. F. band corresponding to about the television channel 20. As shown in Figure 4, only a small portion of the length of the conductor 34*a* is in circuit between the ground plane means 28 and the U. H. F. contact 38, and the transmission line is tuned near the high end of the U. H. F. band, or to about channel 83. The U. H. F. capacitive contact member 38 is directly connected to the V. H. F. contactor, and both are connected to a grounded-grid R. F. amplifier through the inductor 32**, as mentioned above.

In accordance with the invention, signals from the input terminal 10 are conveyed to the signal selection circuit 22 through an all-channel low-side capacity and inductance coupling system. The all-channel coupling system includes an inductor 40 connected between the shield member 15 and the chassis 12, which is at ground potential for the tuner. The inductor 40 is selected to parallel resonate with the capacitance between the shield member and the chassis, at a frequency between the two V. H. F. television frequency ranges. The capacitance between the shield member 15 and the chassis is primarily a function of the size of the portion, such as the flange portion 16, which is positioned closely adjacent and parallel to the chassis 12. However, supplemental and separate capacitor means may be connected from the shield to the chassis where necessary.

Figures 5, 6, 7:
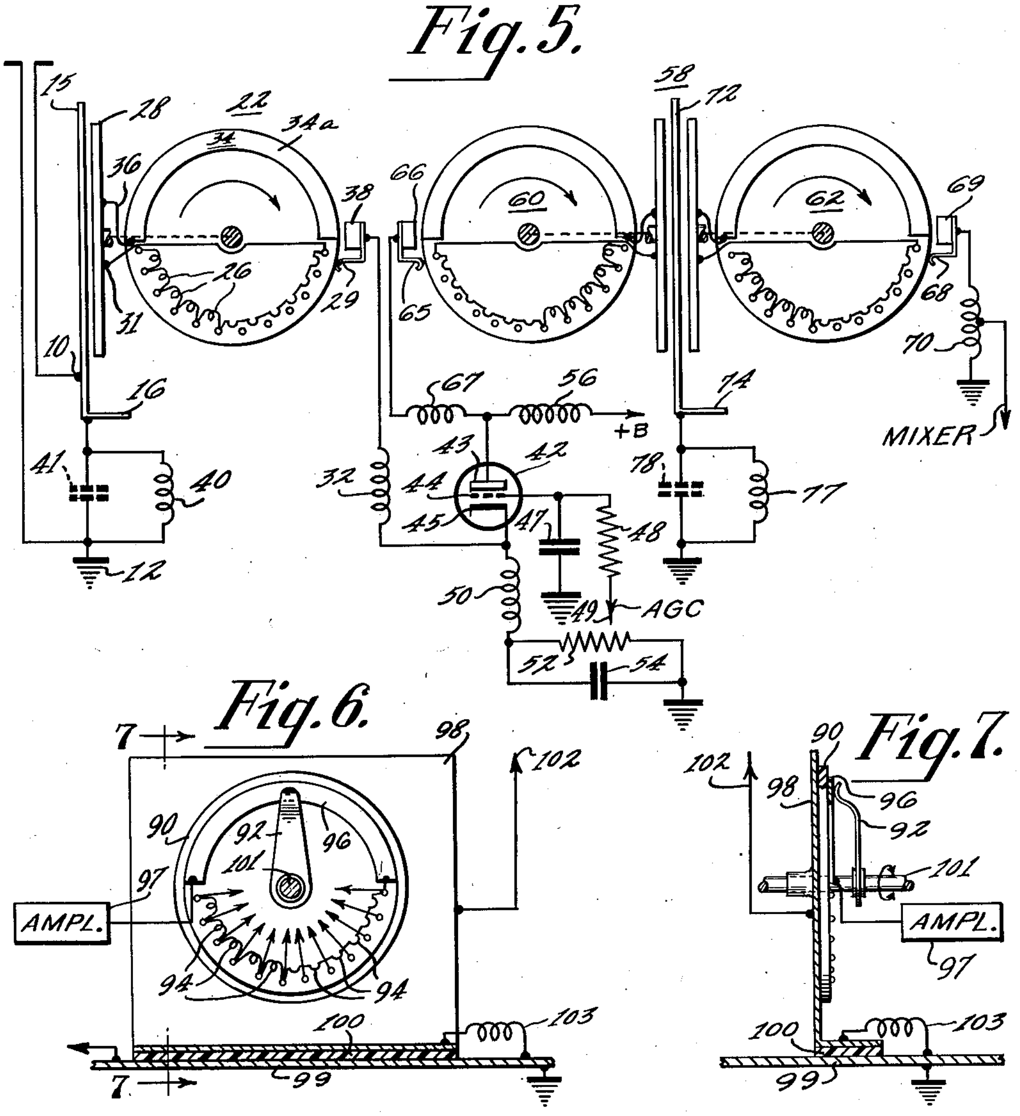
Figure 5 is a schematic circuit diagram of a portion of the all-channel television tuner shown in Figures 1 to 4, which diagrammatically illustrates the tuning circuits and coupling system of the invention.
Figure 6 is a front elevational view of a modification of an all-channel television tuner, including the all-channel coupling circuit of the invention.
Figure 7 is a sectional view of the all-channel television tuner shown in Figure 6 taken on the section lines 7—7.

As can best be seen from Figure 5, the low signal potential side of both the V. H. F. and U. H. F. tuning elements are connected to the ground plane means 28, which, as mentioned above, is closely capacitively coupled to the shield member 15, and may be considered as directly connected to the shield member 15 for signals in the V. H. F. and U. H. F. television bands. The low signal potential side of these tuning circuits are completed to ground through the shield member and the parallel resonant circuit including the inductor 40 and the shield-toground capacitance 41. Parallel resonant circuits appear inductive below the frequency of resonance, and capacitive above the frequency of resonance. Thus, the signals in the lower V. H. F. television range, channels (2–6), the parallel resonant circuit appears inductive. Since the antenna input terminal 10 is connected to the shield member 15, the antenna circuit is also completed to ground through the parallel resonant circuit, and the coupling between the antenna and signal selection circuits for the lower V. H. F. television range is effected by the circulating current in the common effective inductance of the parallel resonant circuits.

For signals in the upper V. H. F. television range, the parallel resonant circuit appears capacitive and the coupling from the antenna circuit to the signal selection circuit 22 is effected for these signals by the circulating current in the common effective capacitance of the parallel resonant circuit. The effective capacitance in series with the signal selection circuit has the desirable effect of permitting a larger inductance value to be used for the upper V. H. F. television band tuning circuit.

In the reception of U. H. F. signals, the effective capacitance of the parallel resonant circuit is great enough to provide substantially a short circuit for U. H. F. signals. However, in the U. H. F. range, the inductance of the shield member 15 becomes appreciable, and further in accordance with the invention, the inductance of the shield member to ground, or the chassis 12, provides the necessary common coupling element for U. H. F. signals. For this reason the antenna or input circuit connection to the shield member 15 is made at about the same distance from the flange member 16 as the average effective contact point that the ground plane makes with the shield member.

Since the configuration of the ground plane means 28 is not symmetrical, the effective connection point of the U. H. F. portion of the signal selection circuit will vary as the disc 24 is rotated. This has the effect of increasing or decreasing the signal path length through the shield member 15, and hence controls the value of the common coupling inductance. The capacity contact 29, however, is positioned so that the signal path length or inductance, through the shield, is maximum at the low frequency end of the U. H. F. television band and gradually decreases as the frequency is increased. This feature affords a more uniform coupling between the antenna circuit and the signal selection circuit over the U. H. F. band due to the more constant common coupling impedance. Since the impedance of the coupling circuit is directly proportional to the product of the signal frequency and the inductance, the effect of decreasing inductance as the signal frequency increases tends to maintain the coupling circuit impedance constant.

The coupling system of the invention is operable to efficiently couple V. H. F. or U. H. F. television signals from the antenna input circuit to the signal selection circuit without the requirement of complicated circuitry or switching. For the lower range of frequencies in the V. H. F. television band, the system operates as a low-side inductance coupling circuit, and for the higher range of V. H. F. television signals, the system operates as a low-side capacity coupling circuit. For U. H. F. signals, the system operates as a low-side inductance coupling system which provides a substantially constant coupling impedance over the 420 mc. U. H. F. television band.

The signal selection circuit 22 is connected to a wide band R. F. amplifier 42 which is operable to efficiently amplify signals through the upper portion of the U. H. F. television band. The R. F. amplifier 42 shown in the drawings is a pencil triode and has an anode 43, a control grid 44 (Fig. 5) and a cathode 45. The amplifier is connected for cathode-input grounded-grid operation, and to this end the signal selection circuit 22 is connected to the cathode 45 and the grid 44 is grounded for signal frequencies through a signal bypass capacitor 47. As is best shown in Figure 1 of the drawings, the R. F. amplifier 42 is mounted in a shield wall 46. The anode 43 and the cathode 45 which are of cylindrical configuration and have annular cooling fins, extend from opposite sides of the shield wall 46. The control grid 45 is physically positioned in the plane of the shield wall 46 between the anode 43 and cathode 45, but is insulated from the shield wall by a mica insulator which forms the dielectric of the capacitor 47 (Fig. 5). A resistor 48 connects the grid 45 to an automatic gain control (A. G. C.) terminal 49.

A direct current path from the cathode 45 to ground is provided through the R. F. choke coil 50 and the cathode biasing resistor 52. A signal bypass capacitor 54 is connected in parallel with the resistor 52 to prevent degenerative feedback at signal frequencies in the amplifier circuit. The anode 43 is connected through an R. F. choke coil 56 to a source of operating potential +B.

A double tuned circuit 58, having a first and second tunable sections 60 and 62, is connected between the R. F. amplifier 42 and a signal mixer stage 64. The first tunable section 60 of the double tuned circuit 58 provides the signal output circuit for the R. F. amplifier 42, and the second tunable section 62 provides the signal input circuit for the mixer 64. Both the first and second tunable sections 60 and 62 are tunable to any one of the eighty-two V. H. F.-U. H. F. television channels, and are identical in construction to the signal selection circuit 22. A V. H. F. tuning circuit contactor 65 and a U. H. F. capacity contact 66 for the first tunable section 60, which are substantially identical to the contacts 29 and 38 of the signal selection circuit are connected to the R. F. amplifier anode 43 through the inductor 67 which is shown in Figure 1 as a short conductive strap. A similar V. H. F. contactor 68 and U. H. F. capacitive contact 69 for the second tunable section 62 are connected to the signal mixer 64 through a tapped inductor 70. Signal coupling is effected between the first and second tunable sections of the double tuned circuit 58, by means of the all-channel coupling circuit of the invention. The first and second tunable sections 60 and 62, respectively, are mounted for rotation with the shaft 25 on opposite sides of a shield member 72. The shield member 72 is similar to the shield member 15, and has a bent over, or flange portion, 74 which is positioned adjacent the tuner chassis 12, but is insulated therefrom by an insulating strip 76. A tuning inductor 77 resonates with the capacity 78 presented between the shield member 72 and the chassis 12 at a frequency between the upper and lower V. H. F. television bands.

The coupling system of the invention operates in exactly the same manner as described above in connection with the antenna and signal selection circuits to couple signals from the first section 60 of the double tuned circuit 58, to the second section 62.

The signal mixer stage, not shown in Figure 5, is physically incorporated in the same envelope as the local oscillator stage 78. A separate tuning section 79, also mounted for rotation with the shaft 25, is provided for tuning the oscillator to the proper local oscillator signal frequency. The oscillator tuning circuit 79, not shown in Figure 5, is similar in construction to the signal selection and double tuned circuits, except that it is designed to be tunable to any of the V. H. F. or U. H. F. channel frequencies plus or minus the frequency of the television receiver I. F. which is ordinarily about 40 mc. Thus the selected and amplified television signals are combined with the local oscillator signals in the mixer stage 64 to provide a difference or I. F. signal for utilization in the receiver. A control knob 80 is provided on the free end of the shaft 25 to control the tuning of the all-channel tuner. Since the signal selection circuit 22, the double tuned circuit 58 and the oscillator tuning circuit 79 are all mounted on the shaft 25, these circuits are tuned simultaneously by rotation of the control knob 80.

Figure 8:
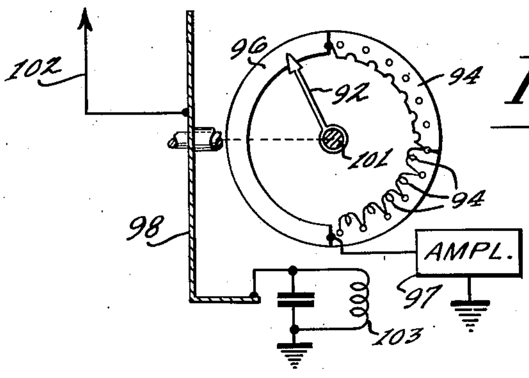
Figure 8 is a schematic circuit diagram of the all-channel television tuner which is shown in Figures 6 and 7, diagrammatically illustrating the coupling circuit of the invention.

Figures 6, 7 and 8 illustrate a modification of the tuner described above in which the tuning circuit elements for the all-channel tuner are mounted on a stationary insulating support member 90, and a rotatable tuning or contact member 92 is provided to select the desired channel frequency. The V. H. F. and U. H. F. tuning circuit portions 94 and 96, respectively, are of conventional construction and similar to those described above in connection with Figures 1 to 5. The U. H. F. tuning circuit portion 96, which comprises a quarter wave tunable transmission line is mounted directly on the insulating support 90. One end of the U. H. F. tuning circuit portion 96 is directly connected with the serially connected inductors of the V. H. F. tuning circuit portion 92, and the other end is connected to an output circuit connection terminal 97.

The stationary insulating support member 90 is mounted on a conductive shield member 98 and serves to insulate the V. H. F. and U. H. F. tuning elements from the shield member. The shield member 98 has a bent over, or flange portion which is positioned closely adjacent to, but insulated from a conductive ground area 99, by an insulating strip 100 to provide a predetermined capacitance between the shield member 98 and the ground plane area 99. The shield member 98 supports, and is directly connected to a rotatable conductive shaft 101 which supports and is in turn connected to the contact member 92. Thus a direct current connection is provided between the contact member 92 and the shield member 98.

The free end of the contact member 92 is adapted to conductively engage and wipe across the conductor which forms the U. H. F. tuning circuit portion 96, and the successive contacts of the V. H. F. tuning portion. When the contact member is near the terminal 97 end of the U. H. F. tuning circuit portion 96, the tuner is tuned to the high frequency end of the U. H. F. band. As the contact member is rotated in a clockwise direction from this position, the frequency of resonance decreases, the selected frequency being a function of the length of the conductor between the contact member 92 and the terminal 97 end of the conductor. Likewise, as the contact member engages the V. H. F. contacts further clockwise movement connects more of the inductors in circuit to tune the tuner to successively lower V. H. F. television channels.

A signal input terminal 102 is connected to the shield member at a point about the same distance up from the flange portion as the rotatable shaft 101. Signals from the input circuit, not shown, are coupled to the tuning circuit by the all-channel coupling circuit of the invention in the same manner as described above in connection with Figures 1 to 5. To this end, an inductor 103 is connected between the shield member 98 and ground area 99 to resonate with the capacitance from the shield member to ground at a frequency between the V. H. F. television ranges. Thus, signals in the lower and upper V. H. F. band are coupled by low side inductive coupling and capacitive coupling respectively, and signals in the U. H. F. band are coupled by low side inductive coupling due to the inductance of the shield member 98.

It can be seen, therefore, that in accordance with the invention, an improved wide band signal coupling system may be provided which is simple in construction, yet capable of providing controlled coupling to and between tuning circuits which are tunable in a wide range of frequencies.

What is claimed is:

1. A signal coupling system for the tuning circuits of a V. H. F.-U. H. F. television tuner comprises the combination of, conductive chassis means at signal ground potential for the V. H. F.-U. H. F. television tuner, a conductive shield member, means supporting said shield member in spaced capacity-coupled relation to said conductive chassis, means providing a parallel resonant circuit tuned to a frequency between the upper and lower frequency ranges of the V. H. F. television band connected between the shield member and the chassis, and means connecting a tuning circuit of the television tuner and a second circuit to said shield member at a point removed from the connection of said parallel resonant circuit to provide coupling between the tuning circuit and said second circuit through the effective reactance of said parallel resonant circuit at V. H. F. television frequencies, and through the inductance of the signal current path between said points in said shield member at U. H. F. television frequencies.

2. A signal coupling system for the tuning circuits of a V. H. F.-U. H. F. television tuner comprising in combination, conductive chassis means providing signal ground for the tuner, a conductive shield member, means supporting said shield member in spaced insulated relation to said conductive chassis, means including the capacity between the shield member and chassis providing a parallel resonant circuit tuned to a frequency between the upper and lower frequency ranges of the V. H. F. television band connected between said shield member and chassis, said parallel resonant circuit being inductive to signals in the lower V. H. F. television range and capacitive to signals in the upper V. H. F. television range, and for signals in the U. H. F. television band said parallel resonant circuit being substantially of zero impedance, and means connecting the low signal potential side of a pair of said circuits to the chassis through a common coupling system comprising at least a portion of said shield member and said parallel resonant circuit to provide coupling between the circuits through the common effective reactance of said parallel resonant circuit for V. H. F. television signals and through the inductance of said shield member for U. H. F. television signals.

3. A signal coupling system for the tuning circuits of a V. H. F.-U. H. F. television tuner comprising the combination of, a first signal circuit selectively tunable to any one of a plurality of television channel frequencies in the V. H. F. and U. H. F. television bands; conductive chassis means providing signal ground for the V. H. F.-U. H. F. television tuner; a conductive shield member supported on said chassis and insulated therefrom; means supporting said first signal circuit parallel to and adjacent said shield member; a second signal circuit; means coupling said first and second signal circuits for signal transfer and providing a common low impedance connection from low signal potential points on said circuits to said shield member, and a parallel resonant circuit tuned to a frequency between the upper and lower frequency ranges of the V. H. F. television band connected from said chassis to a point on said shield member removed from the effective connection points of said first and second signal circuits to provide coupling between the first and second signal circuits through the effective reactance of said parallel resonant circuit at V. H. F. television frequencies, and through the inductance of the signal current path between said points in said shield member at U. H. F. television frequencies.

4. A signal coupling system for the tuning circuits of a V. H. F.-U. H. F. television tuner comprising in combination, a first signal tuning circuit operable to select any one of a plurality of V. H. F. or U. H. F. television channel frequencies, said first signal circuit comprising a V. H. F. tuning circuit portion and a U. H. F. tuning circuit portion, said U. H. F. tuning portion including a resonant transmission line element and conductive ground plane means therefor positioned in spaced relation thereto, means connecting one terminal of said V. H. F. tuning circuit portion and one end of said U. H. F. tuning circuit transmission line to said ground plane means, conductive chassis means providing signal ground for the tuner, a conductive shield member supported on said chassis and insulated therefrom, means for rotatably supporting said first signal tuning circuit in a plane parallel to said shield member, said ground plane means being positioned closely adjacent to said shield member to provide capacitance therebetween and a low impedance signal path from said ground plane means to the shield member, a second signal circuit, and coupling means connected between the shield member and the chassis including a parallel resonant circuit tuned to a frequency between the upper and lower frequency ranges of the V. H. F. television band, said parallel resonant circuit being inductive to signals in the lower V. H. F. television range and capacitive to signals in the upper V. H. F. television range, and having substantially zero impedance for signals in the U. H. F. television band, whereby the coupling between the signal tuning circuits is effected through the common effective reactance of said parallel resonant circuit for V. H. F. television signals and through the inductance of the signal current path in said shield member for U. H. F. television signals.

5. A wide-band signal coupling system for high frequency resonant tuning circuits operable over a wide frequency band comprising the combination of, a conductive chassis providing signal ground for the system, a conductive shield member supported in said chassis and insulated therefrom, means providing a parallel resonant circuit tuned to a frequency within said wideband of frequencies connected between the conductive shield member and the chassis element and including the capacitance between said shield member and said chassis, a tuning circuit and a signal circuit for said system, and means providing a low impedance connection from the low signal potential sides of said tuning and signal circuits to said conductive shield member at a point removed from the connection of said parallel resonant circuit to provide coupling between the tuning circuit and the second signal circuit through the effective reactance of said parallel resonant circuit at lower frequencies in said wide frequency band, and through the inductance of said shield member at higher frequencies in said wide frequency band.

6. A multiband low side signal coupling system for the tuning circuits of a multiband signal receiver comprising in combination, a conductive chassis which is at signal ground potential for said system, a conductive member supported in said chassis but insulated therefrom and providing a predetermined capacitance with said chassis, means providing a low impedance signal connection between the low signal potential sides of a first and second circuit to be coupled and said conductive member, and means providing an inductor connected between said conductive member and said chassis which has a frequency resonance with said predetermined capacitance between two of the lower frequency bands to provide a common coupling reactance between said first and second circuits and the chassis which appears inductive to signal frequencies below said frequency of resonance and capacitive to signal frequencies above said frequency of resonance, said resonant circuit providing substantially a short circuit connection between the conductive member and the chassis for signals in a higher frequency band, the circuit path through said conductive member to said chassis providing common coupling inductance between said first and second circuits for said higher frequency band.

7. A low-side reactive signal coupling system for the tuning circuits of a multiband receiver, comprising in combination, a conductive chassis member, a conductive shield wall spaced from said chassis member and providing a capacitance means therewith, an inductor connected between said shield wall and said chassis member providing with said capacitance means a parallel resonant circuit which resonates between a higher frequency band and a lower frequency band of the signal response of said receiver, the parameters of said circuit being such that said parallel resonant circuit is predominantly inductively reactive in the lower band and predominantly capacitively reactive in the higher band, a pair of signal tuning circuits operable jointly to select any one of a plurality of signals in said frequency ranges or bands and in an ultra high frequency signal band, said tuning circuits having a low potential common connection to the chassis member through a portion of said shield wall and said parallel resonant circuit, whereby inductive coupling for low band signals and capacitive coupling for high band signals are provided between said circuits, and means operable in response to the tuning of said signal tuning circuits and associated with said shield wall for varying the inductive coupling provided by said shield wall to maintain substantially constant coupling impedance therein throughout a still higher frequency band, and the parameters of said parallel resonant circuit further being such that it provides substantially zero impedance in the coupling between said circuits to the ultra high frequency band.

8. A signal coupling system for the tuning circuits of a V. H. F.-U. H. F. television tuned comprising, in combination, a conductive chassis member, a conductive shield wall spaced from said member to provide therewith capacitance means in said system, an inductor element connected between a point on said shield wall and the chassis member to provide with said capacitance means a paralled resonant circuit which resonates between higher and lower V. H. F. bands of the tuner, the parameters of said parallel resonant circuit being such that it appears inductive in the lower band and capacitive in the higher band, means providing a pair of variably tunable signal selecting circuits operable to select any one of a plurality of V. H. F. and U. H. F. television signals, said signal tuning circuits having low signal potential connections with said shield wall at a point removed from said point of connection for said inductor means, whereby the parallel resonant circuit provides with the shield wall a common coupling connection to the chassis member for said tuning circuits, said coupling being inductive for the lower band V. H. F. signals and capacity coupling for the higher band V. H. F. signals, and further being of substantially zero impedance for U. H. F. signals, and means associated with the shield wall and movable in response to tuning operation of said circuits to select signals in the U. H. F. frequency range to provide substantially constant coupling impedance between said tuning circuits in the U. H. F. range by variation of the common inductive coupling in said shield wall between said points of connection therewith for the inductor and said signal tuning circuits.

References Cited in the file of this patent

UNITED STATES PATENTS

| | | |
|---|---|---|
| 2,247,212 | Trevor | June 24, 1941 |
| 2,248,787 | Schrumpf | July 8, 1941 |
| 2,581,159 | Achenbach | Jan. 1, 1952 |
| 2,652,487 | Bussard | Sept. 15, 1953 |
| 2,726,334 | Chelgren et al. | Dec. 6, 1955 |
| 2,748,286 | Bussard | May 29, 1956 |